United States Patent [19]

Mahulikar et al.

[11] Patent Number: 4,704,626
[45] Date of Patent: Nov. 3, 1987

[54] GRADED SEALING SYSTEMS FOR SEMICONDUCTOR PACKAGE

[75] Inventors: Deepak Mahulikar, Meriden; Satyam C. Cherukuri, West Haven, both of Conn.

[73] Assignee: Olin Corporation, New Haven, Conn.

[21] Appl. No.: 752,872

[22] Filed: Jul. 8, 1985

[51] Int. Cl.[4] .................. H01L 23/02; H01L 23/06; H01L 23/10; H01L 23/48
[52] U.S. Cl. ........................................ 357/74; 357/73; 357/67
[58] Field of Search .................. 357/73, 74, 67, 72; 174/52 FP

[56] References Cited

U.S. PATENT DOCUMENTS

| | | | |
|---|---|---|---|
| 3,340,347 | 9/1967 | Spiegler | 357/73 |
| 3,404,319 | 10/1968 | Tsuji et al. | 357/73 |
| 3,937,638 | 2/1976 | Plewes . | |
| 4,135,038 | 1/1979 | Takami et al. | 357/74 |
| 4,434,016 | 2/1984 | Saleh et al. . | |
| 4,524,238 | 6/1985 | Butt | 357/74 |
| 4,542,259 | 9/1985 | Butt | 174/52 FP |

OTHER PUBLICATIONS

"Metal Circuit Board Substrates for Direct Mounting of Ceramic Chip Carriers" by Dance et al., in the First Annual Conference of the Internation Electronics Packaging Society on Nov. 9-10, 1981.

Primary Examiner—Andrew J. James
Assistant Examiner—S. V. Clark
Attorney, Agent, or Firm—Paul Weinstein

[57] ABSTRACT

A graded seal assembly adapted for hermetically sealing a semiconductor package is disclosed. First and second members having first and second coefficients of thermal expansion respectively are provided. A leadframe is disposed between the first and second members. A first sealing glass is bonded to opposite surfaces of the leadframe and is disposed between the leadframe and the first member for sealing the leadframe to the first member. The second sealing glass is bonded to the second member. The second sealing glass has a third CTE which has a mismatch of less than about $5 \times 10^{-7}$ in-/in/°C. with said second member. A graded interface zone having stratified layers fuses the first and second sealing glasses. Each of the layers in the zone has a coefficient of thermal expansion which is mismatched less than about $5 \times 10^{-7}$ in/in/°C. with an adjacent layer to absorb thermal stress formed by exposure of the semiconductor package to thermal cycling.

13 Claims, 3 Drawing Figures

GRADED SEALING SYSTEMS FOR SEMICONDUCTOR PACKAGE

While the invention is subject to a wide range of applications, it is particularly suited for hermetically sealing a semiconductor package and will be particularly described in that connection. More specifically, a graded interface zone is formed between two fused sealing glasses that are disposed between a leadframe and a substrate or cover member of a semiconductor package. The graded interface zone accomodates and relaxes thermal stresses formed from significant mismatch between the coefficients of thermal expansion of the leadframe and the cover or base member.

Hermetic Dual In Line Packages (DIPs) are commercially made using a Fe-42 Ni leadframe, a low thermal expansion glass and an $Al_2O_3$ lid and base. Glass sealing provides hermeticity while a high modulus ($E = 55 \times 10^6$ psi) $Al_2O_3$ lid and base provide mechanical rigidity. Further, the coefficients of thermal expansion of the package components may be closely matched as disclosed in U.S. Pat. No. 4,135,038 to Takamio. For high current densities, however, these packages do not dissipate enough heat because of the relative low thermal conductivity of the $Al_2O_3$.

To improve heat dissipation, metal packages as disclosed in U.S. patent application Ser. No. 710,777 to Pryor et al. may be constructed of metal components which are sealed with a high expansion glass. Preferably, the metal components are a relatively high thermal conductivity copper alloy base, lid and leadframe. An additional advantage may be achieved if the leadframe is constructed of high, electrical conductivity alloy. One of the disadvantages of using a copper alloy lid and base, however, is the lowering of the elastic modulus and mechanical rigidity of the package as compared to conventional ceramic packages. The typical elastic modulus of copper alloys (approximately $16 \times 10^6$ to $21 \times 10^6$ psi) is significantly lower than that of $Al_2O_3$ ($55 \times 10^6$ psi).

It is a problem underlying the present invention to provide a hermetically sealed semiconductor package which is able to withstand significant thermal cycling.

It is an advantage of the present invention to provide a hermetically sealed semiconductor package which obviates one or more of the limitations and disadvantages of the described prior arrangements.

It is a yet further advantage of the present invention to provide a hermetically sealed semiconductor package which prevents excessive build-up of thermal stresses from thermal cycling.

It is a still further advantage of the present invention to provide a hermetically sealed semiconductor package which can be constructed of different materials having significantly different coefficients of thermal expansion.

Accordingly, there has been provided a graded seal assembly adapted for hermetically sealing a semiconductor package. First and second members having first and second coefficients of thermal expansion, respectively, are provided. A leadframe is disposed between the first and second members. A first sealing glass is bonded to opposite surfaces of the leadframe for sealing the leadframe to the second member. A graded seal assembly adapted for hermetically sealing a semiconductor package is disclosed. First and second members having first and second coefficients of thermal expansion respectively are provided. A leadframe is disposed between the first and second members. A first sealing glass is bonded to opposite surfaces of the leadframe and is disposed between the leadframe and the first member for sealing the leadframe to the first member. The second sealing glass is bonded to the second member. The second sealing glass has a third CTE which has a mismatch of less than about $5 \times 10^{-7}$ in/in/° C. with said second member. A graded interface zone having stratified layers fuses the first and second sealing glasses. Each of the layers in the zone has a coefficient of thermal expansion which is mismatched less than about $5 \times 10^{-7}$ in/in/° C. with an adjacent layer to absorb thermal stress formed by exposure of the semiconductor package to thermal cycling.

The invention and further developments of the invention are now elucidated by means of preferred embodiments shown in the drawings.

Figure 1:
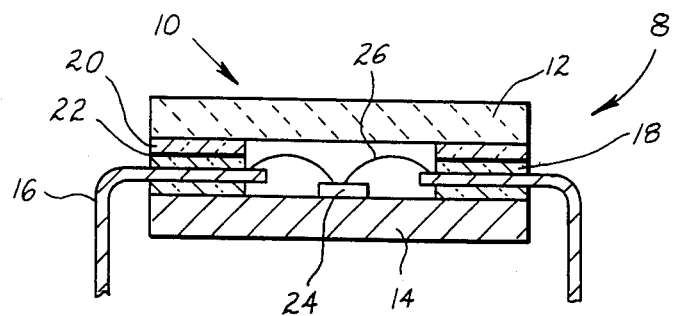
FIG. 1 is a cross-section of a hermetically sealed semiconductor package based on the concepts set forth in the present invention.

The present invention covers a graded seal assembly 8 adapted for hermetically sealing a semiconductor package 10. A first member or lid 12 and a second member or base 14, having first and second coefficients of thermal expansion respectively, are provided. A leadframe 16 is disposed between the lid and base. A first sealing glass 18 is bonded to opposite surfaces of the leadframe and is disposed between the leadframe and the base for sealing the leadframe to the base. A second sealing glass 20 is bonded to the lid. The second sealing glass has a third CTE which has a mismatch of less than about $5 \times 10^{-7}$ in/in/° C. with the lid. A graded interface zone 22 between the first and second sealing glasses has stratified layers. Each of the layers has a coefficient of thermal expansion which is mismatched less than about $5 \times 10^{-7}$ in/in/° C. with an adjacent layer to absorb thermal stress formed by exposure of the semiconductor package 10 to thermal cycling.

Lead borate type sealing glasses, as described in U.S. patent application Ser. No. 651,987 entitled "Sealing Glass Composite" by Smith et al., filed Sept. 19, 1984, are thought to be particularly suitable for the present invenlion. The glass matrlx of the preferred sealing glass composite is a lead borate type glass generally also containing one or more other glass components, such as bismuth, zinc, aluminum, silicon, barium, arsenic, tin, and tellurium which are normally present in their respective oxide forms. These lead borate type solder glasses usually have coefficients of thermal expansion of about 80 to about $130 \times 10^{-7}$ in/in/° C. over the temperature range from ambient to their glass transition temperatures (typically about 300° C.).

Such glasses are used in forming vitreous seals and glass-ceramic or semicrystalline seals as known in the electronic packaging art. Weight percent compositional ranges are set forth below in Table I where the total content of all oxides is 100 percent.

TABLE I

| Oxide | Broad Range (wt. %) | Preferred Range (wt. %) |
|---|---|---|
| PbO | 70-85 | 75-85 |
| ZnO | 0-20 | 0.5-16 |
| $B_2O_3$ | 5-15 | 8-15 |
| $SiO_2$ | 0-10 | 0-5 |
| BaO | 0-3 | 0-2 |
| $SnO_2$ | 0-5 | 0-2 |
| CuO | 0-5 | 0-2 |

Other conventional glassmaking oxides such as CaO, $Bi_2O_3$, $Na_2O$, $K_2O$, $Li_2O$, CdO, and $Fe_2O_3$ can be included. However, it is preferred in many instances not to employ these ingredients but rather to constitute the glass matrix of essentially only those ingredients set forth in Table I above.

In accordance with the present invention, a particulate additive, having a high coefficient of thermal expansion as compared with that of the glass matrix, may be mixed with the lead borate glasses described above to adjust the coefficient of thermal expansion of the final high coefficient of thermal expansion glass composite to be in the range of about 140 to about $230 \times 10^{-7}$ in/in/° C. so as to be compatible with the CTE's of the metal or alloy components to which it is bonded. The particulate is preferably calcium fluoride or barium fluoride. These materials have limited solubility in the sealing glass at the temperature and times required to practice this invention. The additive comprises particles having a size between about 1 to about 150 microns. Preferably, the particles have a size between about 10 to about 75 microns. The particle size is limited because smaller particles more readily dissolve in the glass during the sealing process and cause the sealing glass composite to lose the benefit of the high coefficient of thermal expansion additive. Conversely, if the particles are too large, there is inadequate dispersion of the particles and it is difficult or impossible to provide an adequately smooth surface to make the final seal. The result is a loss of strength due to the formation of voids between the interfaces of the particles. The filler or additive has a maximum critical volume content of up to about 60% volume of the glass matrix to prevent particle interlock. Preferably, the filler in the glass matrix is between about 15 to about 20 wt. % (about 30 to about 40 vol. %) for application to the alloy substrate. The filler in the glass matrix has a coefficient of thermal expansion (CTE) which is higher than the CTE of the glass. More importantly, the CTE of the filler must be higher than that of the metal substrate to which it is bonded in order that the CTE of the glass composite can approximate that of the substrate.

The present invention also provides the mixing of a particulate additive, having a low coefficient of thermal expansion as compared with that of the glass matrix, with the lead borate glasses described above to adjust the coefficient of thermal expansion of the final low coefficient of thermal expansion glass composite to be in the range of about 50 to about $120 \times 10^{-7}$ in/in/° C. This range is selected to reduce the mismatch between the coefficients of thermal expansion of the glass and the metal, alloy or ceramic components to which it is to be bonded. The particulate is preferably selected from the group consisting of beta-eucryptite, aluminum titanate, cordierite and beta-spodumeme. These materials have limited solubility in the sealing glass at the temperature and times required to practice this invention. The additive comprises particles having a size between about 1 to about 150 microns. Preferably, the particles have a size between about 10 to about 75 microns. The particle size is limited because smaller particles more readily dissolve in the glass during the sealing process and cause the sealing glass composite to loose the benefit of the low coefficient of thermal expansion additive. Conversely, if the particles are too large, there is inadequate dispersion of the particles and it is difficult or impossible to provide a smooth enough surface to make the final seal. The result is a loss of strength due to the formation of voids between the interfaces of the particles. The filler or additive has a maximum critical volume content of up to about 40% volume of the glass matrix to prevent particle interlock. Preferably, the filler in the glass matrix is between about 5 to about 30 wt. % for application to the substrate and leadframe. The filler in the glass matrix has a coefficient of thermal expansion which is lower than that of the glass. More importantly, the coefficient of thermal expansion of the filler must be lower than that of the substrate and leadframe to which it is bonded in order that the coefficient of thermal, expansion of the glass composite can approximate that of the substrate and leadframe. For example, beta-eucryptite has a CTE of about $-2.35$ to about $-86 \times 10^{-7}$ in/in/° C. and a density of about 5.5 grams/cc. The fillers for the low thermal expansion glass may be mixed with the powdered sealing glass and applied in any conventional manner.

The present invention is specifically directed to the use of a graded seal to accomodate and relax thermal stresses which are generated between materials of different coefficients of thermal expansion in a semiconductor package. The advantage of the invention is that the semiconductor package can now be constructed of various combinations of materials having significantly different coefficients of thermal expansion. The final hermetically sealed package embodies the significant advantages accorded by each of the various materials and is not restricted prone to failure because of the stresses generated when the components are bonded together without the benefit of the present invention.

A significantly improved hermetically sealed semiconductor packages would embody a high elastic modulus lid, such as ceramic like aluminum oxide, to provide a rigid, relatively thin package. This idealized package would incorporate a copper or copper alloy base to keep the package geometry in a standard configuration, to provide extra rigidity, and to provide superior thermal heat dissipation. Dissipating heat is extremely important to successfully package the latest, heat generating semiconductor devices.

The leadframe is preferably constructed of a thermally stable, glass sealable alloy. A particularly useful alloy is the copper-nickel-aluminum alloys designated as CDA 72400 and disclosed in U.S. Pat. No. 4,434,016 and discussed with regard to semiconductor packaging in U.S. patent application Ser. No. 710,777 entitled "Hermetically Sealed Semiconductor Casing" by Pryor et al. The alloy consists essentially of from about 10% to about 15% nickel, from about 1% to about 3% aluminum, up to about 1% manganese, from about 0.05% to less than about 0.5% magnesium and the balance copper. Silicon should not exceed about 0.05%, lead should be less than about 0.015%, zinc should be less than about 0.5% and phosphorous should be less than about 0.005%. The advantage of using an alloy such as CDA 72400 can be understood from the discussion hereinbelow.

CDA 72400 is an age hardenable alloy which achieves its strength by aging at a temperature of from about 400° to about 550° C. for from about 4 to about 24 hours. Depending on the amount prior cold work (from about 10 to about 40% reduction), yield strengths ranging from about 110 to about 127 ksi are obtained. This alloy has a coefficient of thermal expansion of between about $160 \times 10^{-7}$ to about $170 \times 10^{-7}$ in/in/° C. A high yield strength is particularly important for lead frame applications where the ability to withstand deformation during handling is required. A particularly important quality of a CDA 72400 lead frame is its ability to maintain its strength after thermal exposure during the glass sealing of the lead frame into the semiconductor package as described below. Generally, the sealing requires a temperature of up to about 430° C. for approximately 30 minutes. A limited time exposure to this temperature and time required for glass sealing has no adverse affect on the mechanical properties of the CDA 72400 alloy. In fact, in the areas where the lead frame is bent, some slight increase in yield strength is thought to result. The improved softening resistance of CDA 72400 as compared with other alloys frequently used for semiconductor packaging components is advantageous because it allows higher processing temperatures without any significant loss of strength.

The present invention is not restricted to application of CDA 72400 but includes any desired metal, alloy or composite. Preferably the leadframe would be constructed of a precipitation hardenable alloy system including beryllium containing copper alloys typified by the following commercial alloys: CDA 17000; 17200; 17300; 17500; 17600; and 17700.

Another suitable precipitation hardenble alloy is a magnesium, zirconium, chromium-copper alloy such as MZC ® by Amex Corporation having a nominal composition of 0.06 Mg, 0.15 Zr, 0.4 Cr, and the remainder copper. Also nickel-phosphorous containing copper alloys may be suitable. They would typically have a nominal composition of 1.1 Ni, 0.25 P and the remainder copper. Copper-nickel-tin precipitation hardenable alloys such as CDA 72500 and the spinodal alloys as disclosed in U.S. Pat. No. 3,937,638 and typified by CDA 72900 are thought to be suitable. Dispersion strengthened copper alloys typified by the Glidcop ® materials produced by Glidden Metals, Inc. are also thought to be suitable. Further austenitic, AISI (American Institute of Steel and Iron) 300 series stainless steels would seem to be suitable.

Alloys suitable for forming the semiconductor package components, other than the lead frame include any metal, alloy or composite. In particular, a copper or copper base alloy which has a low oxidation rate and/or is capable of forming a thin refractory oxide layer on at least the surface bonded to the sealing glass is thought to be advantageous. An exemplary alloy capable of forming a refractory oxide layer contains an effective amount of up to about 12% aluminum and the balance copper.

Metals of the above described composition range are thought to be glass sealable with a CTE modified lead borate type glass sealing matrix of the type described hereinabove. The glass may be applied alone or as a mixture of a low melting point glass matrix and a substantially insoluble, high or low thermal expansion additive.

The top member or lid is typically made of a material having a low coefficient of thermal expansion of between about 50 to about $120 \times 10^{-7}$ in/in/° C. These materials are usually selected to consist of ceramics, cermets and metals. For example, as seen in FIG. 1, the lid 12 of the package 10 is preferably formed of a low expansivity material such as alumina ($Al_2O_3$). These materials have a significantly lower coefficient of thermal expansion than the high coefficient of thermal expansion metals such as copper described hereinabove. The effects of this mismatch are enumerated in a paper entitled "Metal Circuit Board Substrates For Direct Mounting of Ceramic Chip Carriers" by Dance et al. in the First Annual Conference of the International Electronics Packaging Society on November 9-10, 1981. The alumina is particularly advantageous in that it has a high elastic modulus of about $55 \times 10^{-6}$ psi. Thus, a rigid package may be formed used a relatively thin lid. The disadvantage of the alumina oxide is the relatively low thermal conductivity ie., about 10.4 BTU/hr/sq. foot/° F./foot for 94% alumina, the industry standard. This is compared to substantially pure copper having a thermal conductivity of about 226 BTU/hr/sq. foot/° F./foot.

An optimized semiconductor package may now be appreciated as being formed of an alumina lid or cover with a pure copper base or substrate and a leadframe of relatively high thermal conductivity which is able to withstand the heat generated during the sealing process. However, until now, the thermal stresses formed at the glass to metal or glass to ceramic interfaces (depending on the degree of mismatch between the coefficients of thermal expansion of these various materials) prevented the construction of this idealized package. The present invention overcomes this problem by providing a graded seal between the materials having of significant coefficient of thermal expansion mismatch to accomodate and relax the thermal stresses. The maximum allowable thermal stress in the glass to metal or glass to aluminum oxide interface is about 2.5 ksi. The result is that the maximum allowable mismatch in thermal expansion coefficients between the interfaced materials is about $5 \times 10^{-7}$ to about $10 \times 10^{-7}$ in/in/° C.

Referring the FIG. 1, there is illustrated a package constructed using the principles of the present invention. The package includes an aluminum oxide lid 12, a copper alloy leadframe 16 having a relatively high coefficient of thermal expansion and a copper base 14 having a very high coefficient of thermal expansion. The glass 18 has a relatively high coefficient of thermal expansion in accordance with the principles set forth hereinabove. The glass preferably has a slightly lower coefficient of thermal expansion than the leadframe. When the glass fuses to the surfaces of the leadframe, this slight mismatch in coefficients of thermal expansion forms a mechanical bond with the leadframe. The high expansion glass cannot have a coefficient of thermal expansion which is less than about $5 \times 10^{-7}$ in/in/° C. from that of the leadframe. However, it is also within the terms of the present invention that the high expansion glass have a higher coefficient of thermal expansion than the leadframe. Presumably, in the latter instance, the glass would chemically bond to the leadframe to prevent interdiffusion between the glass and the leadframe and failure of the hermetic package. Since the coefficients of thermal expansion of the leadframe and copper base are close to one another, the first sealing glass 18 could also be bonded directly to the base 14. A low expansion glass 20, formulated in accordance with the principles described above, has a coefficient of thermal expansion which closely matches that of the aluminum oxide lid and is bonded thereto. Then, the first high expansion glass 18 and the second low expansion glass 20 are disposed upon one another and heated to fuse them together at an interface 22. Since the mismatch of the coefficients of thermal expansion of the high and low expansion glasses may be significant, the graded interface zone 22 must be able to absorb any thermal stresses which develop. This is accomplished because the two glasses diffuse at the interface zone so that each glass partially diffuses into the other glass. The resulting interface zone is comprised of stratified layers. The composition and density of the glass in each layer in the interface zone is slightly different from each adjacent layer and forms a graduated gradient between adjacent glass layers. Each layer has a maximum CTE mismatch of about $5 \times 10^{-7}$ in/in/° C. with an adjacent layer. The graduated, stratified layers of the interface zone are able to accomodate and relax thermal stress generated by exposure to thermal cycling. Also the interface zone layers are able to span the mismatch between the coefficients of thermal expansion of the first and second sealing glasses. The key is that a maximum CTE mismatch of about $5 \times 10^{-7}$ in/in/° C. can exist between any adjacent layers.

Referring again to FIG. 1, the process by which the casing 10 is assembled is described in order to better understand the interaction of the properties of the different materials to construct a superior semiconductor package. The high CTE glass can be prepared by weighing, blending and melting the sealing glass matrix. It is then fritted by pouring into water or through water cooled rolls. The dried frit is milled to a standard of about 5% on a 400 mesh screen with no residue on a 100 mesh screen. A filler, such as calcium fluoride, is milled and mixed with the glass in proportion of about 12 to about 20 parts of filler per 100 parts of glass. The exact ratio of filler to glass matrix is adjusted to give a high coefficient of thermal expansion compatible with the base and lead frame.

Next, 100 parts of the glass filler mixture is blended with about 0.5 to about 3 parts of a binder such as Elvacite ®, a product of DuPont Corporation, and with about 25 to about 40 parts of a conventional vehicle such as terpeneol. The result is a high CTE, sealing glass paste with a viscosity of approximately 30,000 poises.

Concurrently, a low coefficient of thermal expansion sealing glass paste can be prepared by mixing the sealing glass matrix disclosed above with a filler such as beta-eucryptite. The beta-eucryptite is milled and mixed with the glass in proportion of about 10 to about 30 parts of filler per hundred parts of glass. The exact relationship of the glass matrix is adjusted to give a low coefficient of thermal expansion compatible with the lid. Next, 100 parts of the glass filler mixture is blended with about 0.5 to about 3 parts of a binder such as Elvacite ®, a product of DuPont Corporation and with about 25 to about 40 parts of a conventional vehicle such as terpeneol. The result is a low coefficient of thermal expansion which is compatible with the CTE of the lid.

The material for the base and lid or cover member is cut and formed to the desired shape. Then it is cleaned by conventional metal cleaning procedures. A first sealing glass paste 18 and a second sealing glass 20, described above, are applied to base 14 and lid 12, respectively in a conventional screen printing operation. The first glass is applied in a predetermined pattern around the periphery of the base leaving uncoated areas in the middle of the base for subsequent attachment of the die 24. The coated lid and base are first heated to remove the vehicle; then heated further to remove the binder; finally they are heated to a temperature in the vicinity of 380° C. to sinter the sealing glass matrix and filler particles composite to the base.

The lead frame 16, as described above, is prepared, stamped or etched into the desired pattern and cleaned in accordance with conventional metal cleaning procedures. The lead frame 16 is then placed on top of a glass coated base or substrate 14 and the assembly is fired at a temperature of about 400° to about 475° C. for about 5 to about 15 minutes. In this operation, the glass coating flows into a continuous glaze. The lead frame sinks into and bonds to the glaze such that glass flows through the openings in the lead frame. At this point, a die 24 is attached to the base by any conventional means. Application of this seal usually involves heating the assembly to a temperature of about 400° to about 450° C. Lead wires 26 are now bonded between the die and the inner ends of the lead frame. The package is finally sealed by placing the coated lid or cover member onto the upper surface of the glass 18 protruding above the lead frame and heating the glass assembly to a temperature of about 400° to about 475° C. for about 5 to about 15 minutes to melt the glass on the cover and the leadframe and hermetically seal the package.

The glass 18 and 20 diffuse into each other and form the graduated layers of interface zone 22. The composition and density of each layer forms a smooth, graduated gradient of coefficients of thermal expansion between the CTE of the high expansion glass 18 and the CTE of the low expansion glass 20.

Figure 2:
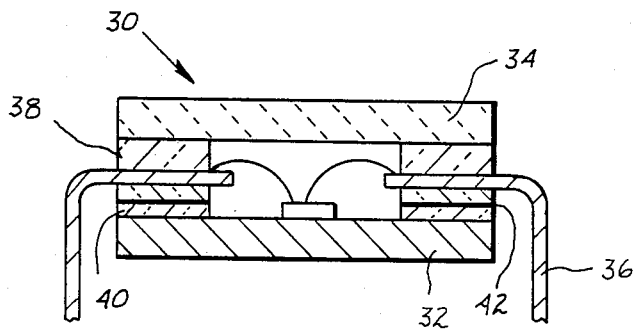
FIG. 2 is a cross-section of a second embodiment of a hermetically sealed semiconductor package based on the concepts set fortn in the present invention.

FIG. 2 illustrates a second embodiment of the present invention comprising a semiconductor package 30 having a high CTE base 32, a low CTE lid 34 and a low expansion alloy leadframe 36, such as 42-Ni. In this embodiment, the low expansion glass 38, which is the same as that described in the embodiment of FIG. 1, is fused onto opposite surfaces of the leadframe to minimize the mismatch between the coefficients of thermal expansion of the leadframe and the glass. Then, a high coefficient of thermal expansion glass 40 is provided between the base 32 and the surface of the lower expansion glass 38 which protrudes from one side of the leadframe. The graduated layers of the interface zone 42, which is formed in accordance with the description of the interface zone 22 of FIG. 1. The process of constructing the semiconductor package 30 is essentially the same as that described hereinabove with regard to the semiconductor package 10. In particular, the graduated interface zone 42 of stratified layers spans the CTE mismatch of the glasses 38 and 40.

Figure 3:
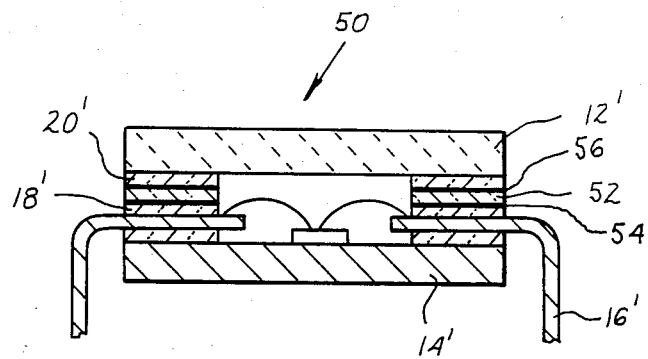
FIG. 3 is a cross-section of a third embodiment of a hermetically sealed semiconductor package providing three sealing glasses with different coefficients of thermal expansion.

Referring to FIG. 3, there is shown a semiconductor package 50 which is essentially the same as that illustrated in FIG. 1 except that a third glass layer 52 is provided between the layers 20' and 18'. The components of FIG. 3 which are substantially the same as those shown in FIG. 1 have the same reference numerals with the addition of a prime. The additional glass layer 52 has a coefficient of thermal expansion which is between that of the glass layer 18' and 20'. The two resulting interface layers 54 and 56 provide additional flexibility in accomodating the mismatch in the coefficient of thermal expansion between the leadframe and the lid. If desired, two or more additional glass layers with intermediate coefficients of thermal expansion and resulting interface zones may be provided between the low expansion glass sintered to the lid and the high expansion glass sintered to the top surface of the leadframe. The semiconductor package 50 would be fabricated in the same manner as described with regard to the semiconductor package 10 with the exception of the requirement of forming and screen printing on the intermediate glass layer 52 onto either the glass layer 18' or 20'.

It is also within the terms of the present invention to provide one or more additional glass layers having a CTE intermediate that of the high and low CTE glasses 40 and 38, respectively in FIG. 2.

The patents, patent applications and articles set forth in this application are intended to be incorporated by reference herein.

It is apparent that there has been provided in accordance with this invention graded sealing systems for semiconductor package which satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternative, modifications and all variations as fall within the spirit and broad scope of the appended claims.

What is claimed:

1. A hermetically sealed semiconductor package, comprising:
    a base member having a first coefficient of thermal expansion;
    a lid member having a second coefficient of thermal expansion, said second coefficient of thermal expansion being greater than said first coefficient of thermal expansion, the material of said lid member having a coefficient of thermal expansion of less than about $120 \times 10^{-7}$ in./in.$°$ C. and being selected from the group consisting of metals, alloys, ceramics and cermets;
    a leadframe disposed between said base member and lid member, the material of said base member and said leadframe having a coefficient of thermal expansion of more than about $140 \times 10^{-7}$ in./in./$°$ C. and selected from the group consisting of metals and alloys;
    a first sealing glass bonded to opposite surfaces of said leadframe and being disposed between said leadframe and said base member for sealing said leadframe to said base member, said first sealing glass having a fourth coefficient of thermal expansion with a mismatch of less than about $10 \times 10^{-7}$ in./in./$°$ C. with the first coefficient of thermal expansion of said base member;
    a second sealing glass bonded to said lid member, said second sealing glass having a third coefficient of thermal expansion which has a mismatch of less than about $10 \times 10^{-7}$ in./in./$°$ C. with the second coefficient of thermal expansion of said lid member; and
    a graduated interface zone wherein said first and second sealing glases are diffused into each other to form a graduated gradient of coefficients of thermal expansion between said leadframe and said lid member to absorb thermal stresses formed by exposure of said semiconductor package to thermal cycling.

2. The hermetically sealed semiconductor package of claim 1 wherein said first and second sealing glasses each comprise a glass selected from the group consisting of borate, borosilicate, lead borate, lead-zinc borate, lead borosilicate and lead-zinc borosilicate glasses.

3. The hermetically sealed semiconductor package of claim 2 further including means added to said glass to adjust the coefficient of thermal expansion of the resulting sealing glass.

4. The hermetically sealed semiconductor package of claim 3 wherein said added means comprises a first additive mixed into said glass to decrease the coefficient of thermal expansion of the resulting second sealing glass, said first additive being selected from the group consisting of beta-eucryptite, aluminum titanate, cordierite and beta-spodumeme.

5. The hermetically sealed semiconductor package of claim 4 wherein said added means comprises a second additive mixed into said glass to increase the coefficient of thermal expansion of the resulting first sealing glass, said second additive being selected from the group consisting of calcium fluoride and barium fluoride.

6. The hermetically sealed semiconductor package as in claim 3 wherein:
    the mismatch between the first coefficient of thermal expansion and the fourth coefficient of thermal expansion is from about $5 \times 10^{-7}$ to about $10 \times 10^{-7}$ in./in./$°$ C.; and
    the mismatch between the second coefficient of thermal expansion and the third coefficient of thermal expansion is from about $5 \times 10^{-7}$ to about $10 \times 10^{-7}$ in./in./$°$ C.

7. A hermetically sealed semiconductor package, comprising:
    a base member having a first coefficient of thermal expansion;
    a lid member having a second coefficient of thermal expansion, the material of said lid member having a coefficient of thermal expansion of less than about $120 \times 10^{-7}$ in./in./$°$ C. and being selected from the group consisting of metals, alloys, ceramics and cermets;
    a leadframe disposed between said base member and lid member, the material of said base member and said leadframe having a coefficient of thermal expansion of more than about $140 \times 10^{-7}$ in./in.$°$ C. and selected from the group consisting of metals and alloys;
    a first sealing glass bonded to opposite surfaces of said leadframe and being disposed between said leadframe and said base member for sealing said leadframe to said base member, said first sealing glass having a fourth coefficient of thermal expansion with a mismatch of less than about $10 \times 10^{-7}$ in./in./$°$ C. with the first coefficient of thermal expansion of said base member;
    a second sealing glass bonded to said lid member, said second sealing glass having a third coefficient of thermal expansion which has a mismatch of less than about $10 \times 10^{-7}$ in./in./$°$ C. with the second coefficient of thermal expansion of said lid member;
    a third sealing glass having a fifth coefficient of thermal expansion, said fifth coefficient of thermal expansion being of a value between the forth coefficient of thermal expansion of said first sealing glass and the third coefficient of thermal expansion of the second sealing glass;

said third sealing glass being sealed between said first and second sealing glasses;

a second graduated interface zone wherein said first and third sealing glasses are diffused into each other to form a graduated gradient of coefficients of thermal expansion between said fourth coefficient of thermal expansion and said fifth coefficient of thermal expansion;

a third graduated interface zone wherein second and third sealing glasses are diffused into each other to form a graduated gradient of coefficients of thermal expansion between said third coefficient of thermal expansion and said fifth coefficient of thermal expansion; and said first, second and third sealing glasses being provided to absorb thermal stress formed by exposure of the semiconductor package to thermal cycling.

8. The hermetically sealed semiconductor package of claim 7 wherein said first and second and third sealing glass each comprise a glass selected from the group consisting of borate, borosilicate, lead borate, lead-zinc borate, lead borosilicate and lead-zinc borosilicate glasses.

9. The hermetically sealed semiconductor package of claim 8 further including means added to said selected glass to adjust the thermal expansion of the resulting sealing glass.

10. The hermetically sealed semiconductor package of claim 9 wherein said added means comprises a first additive mixed into said glass to decrease the coefficient of thermal epansion of the resulting second sealing glass, said first additive being selected from the group consisting of beta-eucryptite, aluminum titanate, cordierite and beta-spodumeme.

11. The hermetically sealed semiconductor package of claim 9 wherein said added means comprises a second additive mixed into said glass to increase the coefficient of thermal expansion of the resulting first sealing glass, said second additive being selected from the group consisting of calcium fluoride and barium fluoride.

12. The hermetically sealed semiconductor package as in claim 9 wherein:

the mismatch between the first coefficient of thermal expansion and the fourth coefficient of thermal expansion is from about $5 \times 10^{-7}$ to about $10 \times 10^{-7}$ in./in./° C.; and the mismatch between the second coefficient of thermal expansion and the third coefficient of thermal expansion is from about $5 \times 10^{-7}$ to about $10 \times 10^{-7}$ in./in./° C.

13. The hermetically sealed semiconductor package of claim 3 further including a semiconductor device electrically connected to said leadframe and hermetically sealed in said semiconductor package.

* * * * *